United States Patent
Samejima et al.

(10) Patent No.: US 9,313,903 B2
(45) Date of Patent: Apr. 12, 2016

(54) METHOD OF MANUFACTURING PRINTED WIRING BOARD

(75) Inventors: Sohei Samejima, Tokyo (JP); Tsuyoshi Ozaki, Tokyo (JP); Hiroyuki Osuga, Tokyo (JP); Teruhiko Kumada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 73 days.

(21) Appl. No.: 13/142,113

(22) PCT Filed: Dec. 24, 2009

(86) PCT No.: PCT/JP2009/071393
§ 371 (c)(1),
(2), (4) Date: Aug. 18, 2011

(87) PCT Pub. No.: WO2010/074121
PCT Pub. Date: Jul. 1, 2010

(65) Prior Publication Data
US 2011/0290408 A1 Dec. 1, 2011

(30) Foreign Application Priority Data

Dec. 25, 2008 (JP) ................................. 2008-330738
Apr. 23, 2009 (JP) ................................. 2009-105378

(51) Int. Cl.
*H05K 3/46* (2006.01)
*H05K 3/44* (2006.01)
*H05K 3/42* (2006.01)

(52) U.S. Cl.
CPC ................ *H05K 3/445* (2013.01); *H05K 3/462* (2013.01); *H05K 3/429* (2013.01); *H05K 3/4626* (2013.01);
(Continued)

(58) Field of Classification Search
CPC .. H01L 2224/211; H05K 3/4644; H05K 3/46; H05K 1/0298; H05K 3/429; H05K 3/4602; H05K 1/00; H05K 2201/09536; H05K 3/0029; H05K 3/0047; H05K 3/0094; H05K 3/4626; H05K 3/426; H05K 3/42; H05K 3/0035; H05K 3/465

USPC .......................................... 156/182; 427/97.2
See application file for complete search history.

(56) References Cited

U.S. PATENT DOCUMENTS 5,421,083 A * 6/1995 Suppelsa .............. H05K 1/0222
174/250
6,869,664 B2 3/2005 Vasoya et al.
(Continued)

FOREIGN PATENT DOCUMENTS

JP 5 63304 9/1993
JP 2693005 12/1997
(Continued)

OTHER PUBLICATIONS

International Search Report issued Apr. 6, 2010 in PCT/JP09/071393 filed Dec. 24, 2009.
(Continued)

*Primary Examiner* — Michael N Orlando
*Assistant Examiner* — Margaret Squalls
(74) *Attorney, Agent, or Firm* — Oblon, McClelland, Maier & Neustadt, L.L.P.

(57) ABSTRACT

A method of manufacturing a printed wiring board (10) includes the steps of: forming a core including carbon fiber reinforced plastic having a primary through hole (3a); forming a first adhesive member (4a) on a lower surface of the core to cover the primary through hole (3a); charging an insulating member into the primary through hole (3a); forming a second adhesive member (4b) on an upper surface of the core; forming a third adhesive member (6a) below the first adhesive member (4a); forming a fourth adhesive member (6b) on the second adhesive member (4b); and forming interconnections on the core.

3 Claims, 13 Drawing Sheets

(52) U.S. Cl.
CPC ...... *H05K 3/4641* (2013.01); *H05K 2201/0195* (2013.01); *H05K 2201/0209* (2013.01); *H05K 2201/0323* (2013.01); *H05K 2201/0347* (2013.01); *H05K 2201/09809* (2013.01)

(56) References Cited

U.S. PATENT DOCUMENTS

| | | | |
|---|---|---|---|
| 2006/0175084 A1 | 8/2006 | Okamoto et al. | |
| 2007/0240901 A1 | 10/2007 | Okamoto et al. | |
| 2008/0011507 A1* | 1/2008 | Vasoya | 174/260 |
| 2008/0047742 A1 | 2/2008 | Samejima et al. | |
| 2009/0107702 A1* | 4/2009 | Samejima et al. | 174/254 |

FOREIGN PATENT DOCUMENTS

| | | |
|---|---|---|
| JP | 11 40902 | 2/1999 |
| JP | 2000 340895 | 12/2000 |
| JP | 2003 188308 | 7/2003 |
| JP | 2006 114606 | 4/2006 |
| JP | 2006 222216 | 8/2006 |
| JP | 2006-310788 | 11/2006 |
| JP | 2007-49106 | 2/2007 |
| JP | 2007-273896 | 10/2007 |
| JP | 2008 53362 | 3/2008 |
| JP | 2008 66375 | 3/2008 |

OTHER PUBLICATIONS

U.S. Appl. No. 13/520,812, filed Jul. 6, 2012, Osuga, et al.
Notice of Grounds of Rejection issued Sep. 18, 2012 in Japanese Patent Application No. 2010-544099 (with English translation).
Office Action issued Feb. 4, 2014 in Japanese Patent Application No. 2013-16244 (with English translation).

* cited by examiner

METHOD OF MANUFACTURING PRINTED WIRING BOARD

TECHNICAL FIELD

The present invention relates to a method of manufacturing a printed wiring board, and in particular to a method of manufacturing a printed wiring board having a core including carbon fiber reinforced plastic.

BACKGROUND ART

In recent years, it has become desirable for printed wiring boards to include a substrate with a good heat dissipation property, as electronic components are mounted in higher density. A metal core substrate has been known as a printed wiring board excellent in heat dissipation property, and has already been put to practical use. The metal core substrate uses a metal having high thermal conductivity, such as aluminum (Al), copper (Cu), or the like, as a core material, and thereby can dissipate heat from a heat-generating component throughout the printed wiring board and suppress an increase in the temperature of the heat-generating component. Above all, aluminum, which has a low specific gravity, is generally used as a core material.

However, aluminum has a high coefficient of thermal expansion of about 24 ppm/° C., whereas a ceramic component has a low coefficient of thermal expansion of about 7 ppm/° C. Therefore, there arises a problem that when a heat cycle test is conducted, a crack occurs at a solder joint portion due to a difference in the coefficients of thermal expansion of aluminum and the ceramic component, failing to achieve mounting reliability.

As a core material capable of solving the above problem, carbon fiber reinforced plastic (hereinafter also referred to as CFRP) has been known (for example, see Japanese Patent Laying-Open No. 11-40902 (Patent Document 1)). CFRP is a composite material including carbon fiber and resin. The carbon fiber is roughly classified into PAN (polyacrylonitrile)-based carbon fiber and pitch-based carbon fiber (carbon fiber using petroleum pitch as a starting material). The carbon fiber, both PAN-based and pitch-based, has a low coefficient of thermal expansion of ±2 ppm/° C. In the carbon fiber, pitch-based carbon fiber has a thermal conductivity higher than that of PAN-based carbon fiber, and some of pitch-based fibers have a thermal conductivity of not less than 500 W/(m·K). In addition, the carbon fiber has a low specific gravity of about 2 g/cm$^3$. As a CFRP core, a core formed by laminating carbon fibers each arranged unidirectionally with the directions thereof being changed, or impregnating cloth with resin is used. If a core substrate can be fabricated using this CFRP, a substrate with high thermal conductivity and more excellent in mounting reliability than aluminum can be obtained.

Since the core materials described above are all electrically conductive, it is necessary to insulate the core material from a penetrating through hole for connecting interconnections provided above and below the core material, using resin for filling a through hole. Generally, a through hole is filled by stacking and laminating a semi-cured prepreg, which is prepared by impregnating glass cloth with epoxy resin, above and below a core material having the through hole formed therein. That is, the prepreg is melted by heat at the time of lamination, and the resin caused to flow by pressurization is charged into the through hole.

However, in the case where a conventional prepreg is used to fill a through hole, since resin has a low thermal conductivity of about 0.2 W/(m·K) heat dissipation property is limited by the hole-filling resin, causing a problem that heat from a heat-generating component cannot be fully conducted to the core. Further, since the charged resin has a coefficient of thermal expansion of 60 ppm/° C. whereas the CFRP core has a coefficient of thermal expansion of about 0 ppm/° C., there is a large difference in the coefficients of thermal expansion, leading to occurrence of a crack in the resin or the CFRP core.

Therefore, the inventors of the present invention found that a CFRP core substrate having higher heat dissipation property and higher reliability than a conventional one can be obtained by applying a filler-containing resin sheet having a high thermal conductivity and a low coefficient of thermal expansion as a hole-filling resin, and filling a hole by laminating the resin sheet (for example, see Japanese Patent Laying-Open No. 2008-53362 (Patent Document 2)).

PRIOR ART DOCUMENTS

Patent Documents

Patent Document 1: Japanese Patent Laying-Open No. 11-40902
Patent Document 2: Japanese Patent Laying-Open No. 2008-53362

SUMMARY OF THE INVENTION

Problems to be Solved by the Invention

However, in the case where epoxy resin containing a filler such as alumina is used as the hole-filling resin described above, since the lowest melt viscosity of the resin is as high as about 30000 Pa·s, a resin sheet with a thickness comparable to or greater than that of the CFRP core is required. Therefore, there has been a problem that the substrate thickness cannot be reduced.

The present invention has been made to solve problems as described above, and one object of the present invention is to provide a method of manufacturing a printed wiring board having a reduced thickness and an improved heat dissipation property.

Means for Solving the Problems

A method of manufacturing a printed wiring board of the present invention includes the steps of: forming a core including carbon fiber reinforced plastic having a primary through hole; forming a first adhesive member on a lower surface of the core to cover the primary through hole; charging an insulating member into the primary through hole; forming a second adhesive member on an upper surface of the core; and forming interconnections on the core.

Effects of the Invention

According to the method of manufacturing a printed wiring board of the present invention, the insulating member can be charged using the first adhesive member formed on the lower surface of the core as a bottom, and the second adhesive member can serve as a lid for the insulating member. Hence, the first and second adhesive members are required to have only a thickness necessary to serve as a bottom and a lid, and they are not required to have a thickness determined by considering conditions for melting and the like as is conventionally required. Therefore, the thickness of the core, that is, the sum of the thicknesses of the first and second adhesive members and the thickness of the insulating member, can be reduced.

Further, since the sum of the thicknesses of the adhesive members and the thickness of the insulating member is reduced, heat from a component is readily conducted to the core. Thus, heat dissipation property can be improved.

Consequently, a printed wiring board having a reduced thickness and an improved heat dissipation property can be manufactured.

MODES FOR CARRYING OUT THE INVENTION

Figure 1:
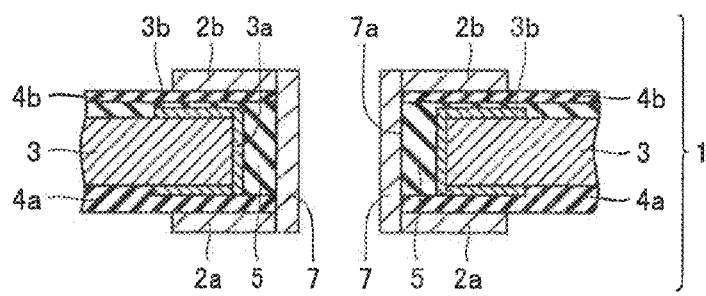
FIG. 1 is a cross sectional view schematically showing a configuration of a printed wiring board in Embodiment 1 of the present invention.

Hereinafter, embodiments of the present invention will be described with reference to the drawings. In the drawings below, identical or corresponding parts will be designated by the same reference numerals, and the description thereof will not be repeated.

Embodiment 1

FIG. 1 is a cross sectional view schematically showing a configuration of a printed wiring board in Embodiment 1 of the present invention. As shown in FIG. 1, a printed wiring board 1 mainly has signal circuit layers 2a and 2b, a CFRP core 3 as a core including a CFRP layer, a first adhesive member 4a, a second adhesive member 4b, and insulating resin 5 as an insulating member.

Signal circuit layers 2a, 2b are formed on surfaces of the first and second adhesive members 4a, 4b, and have interconnections. The interconnections are made of, for example, copper.

CFRP core 3 is provided between signal circuit layers 2a and 2b. CFRP core 3 may be any composite material including carbon fiber and resin, and the content rate, the structure (i.e., an unidirectional material or a cross material), and the like of the carbon fiber in the composite material are not particularly limited. Further, CFRP core 3 has a primary through hole 3a. A coating layer 3b coats a wall surface of primary through hole 3a and a side surface and a portion of top and bottom surfaces of CFRP core 3. Coating layer 3b is made of, for example, copper.

A pair of upper and lower signal circuit layers 2a, 2b are in electrical conduction by a penetrating through hole 7 formed by plating copper on a secondary through hole 7a. Since CFRP core 3 is electrically conductive, if penetrating through hole 7 is handled as a signal line, it is necessary to insulate CFRP core 3 from penetrating through hole 7. In that case, secondary through hole 7a having a smaller diameter is formed coaxially with primary through hole 3a, and electrical insulation is established by insulating resin 5.

Figure 2:
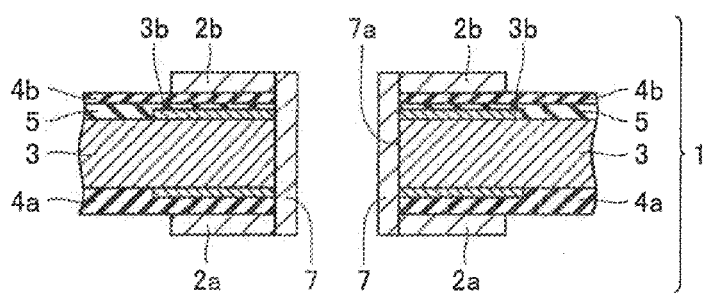
FIG. 2 is a cross sectional view schematically showing a configuration different from that of the printed wiring board in Embodiment 1 of the present invention.

If penetrating through hole 7 is not handled as a signal line, the primary through hole is not formed and a short circuit is established between CFRP core 3 and penetrating through hole 7, as shown in FIG. 2. Thereby, heat dissipation property can be improved. FIG. 2 is a cross sectional view schematically showing a configuration different from that of the printed wiring board in Embodiment 1 of the present invention.

The first and second adhesive members 4a, 4b are formed between signal circuit layers 2a, 2b and CFRP core 3. Preferably, the first and second adhesive members 4a, 4b are ordinary prepregs made of resin and glass cloth, or prepregs made of an inorganic filler, resin, and glass cloth. This is because, when interconnections are directly formed on the first and second adhesive members 4a, 4b and the first and second adhesive members 4a, 4b serve as outermost surfaces, occurrence of a crack due to heat cycles can be suppressed by forming a prepreg including glass cloth at the outermost surface.

Insulating resin 5 is formed between the first and second adhesive members 4a, 4b, coating layer 3b, and penetrating through hole 7. Preferably, insulating resin 5 is made of an inorganic filler and resin, and has a thermal conductivity of 1 to 15 W/(m·K). Examples of the resin for insulating resin 5 include epoxy, bismaleimide, cyanate ester, polyimide, and the like. Further, examples of the inorganic filler include oxides and nitrides such as alumina, silica, magnesia, aluminum nitride, boron nitride, and silicon nitride, and a mixture thereof may be used. The reason that it is preferable to use filler-containing resin as insulating resin 5 is to reduce stress applied between CFRP core 3 and penetrating through hole 7 and to improve thermal conductivity.

It is to be noted that, taking hydrolyzability into consideration, the contained inorganic filler is preferably an oxide. Although alumina is desirable to improve thermal conductivity, alumina is hard, and thus a drill blade is likely to be worn, which may result in a reduced life or a broken drill. Therefore, in the case where there is a through hole or the like having a small diameter of not more than 0.8 mm, it is desirable to select silica as an oxide, considering workability.

The first and second adhesive members 4a, 4b and insulating resin 5 may be made of different materials or the same material. Preferably, the first and second adhesive members 4a, 4b are made of the same material, as stress such as warpage can be relaxed by employing a symmetric structure.

Subsequently, a method of manufacturing the printed wiring board in the present embodiment will be described. FIGS. 3 to 13 and 34 are schematic cross sectional views showing a method of manufacturing the printed wiring board in Embodiment 1 of the present invention in the order of steps.

Firstly, as shown in FIGS. 3 to 6, CFRP core 3 having primary through hole 3a is formed. Specifically, for example, the steps described below are performed.

Figure 3:
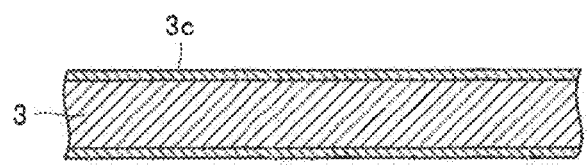
FIG. 3 is a schematic cross sectional view showing a method of manufacturing the printed wiring board in Embodiment 1 of the present invention in the order of steps.
Figure 4:
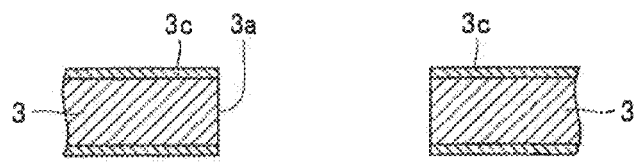
FIG. 4 is a schematic cross sectional view showing the method of manufacturing the printed wiring board in Embodiment 1 of the present invention in the order of steps.
Figure 5:
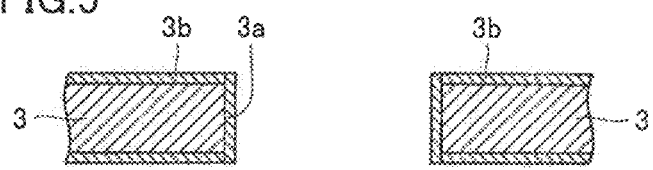
FIG. 5 is a schematic cross sectional view showing the method of manufacturing the printed wiring board in Embodiment 1 of the present invention in the order of steps.
Figure 6:
FIG. 6 is a schematic cross sectional view showing the method of manufacturing the printed wiring board in Embodiment 1 of the present invention in the order of steps.

As shown in FIG. 3, a double-sided copper clad CFRP core in which copper foil 3c is bonded on both sides of CFRP core 3 is prepared. Thereafter, as shown in FIG. 4, primary through hole 3a is formed in the CFRP core. Next, as shown in FIG. 5, plating such as copper plating is performed on CFRP core 3. Thereby, the wall surface of primary through hole 3a is coated with coating layer 3b made for example by copper plating, preventing falling off of carbon powders. Then, as shown in FIG. 6, coating layer 3b is patterned, and an unnecessary portion of coating layer 3b is removed. Thereby, stress relaxation and weight reduction can be achieved.

Using a double-sided copper clad board (double-sided copper clad CFRP core) as a starting material has the following four advantages. Firstly, plating such as copper plating can be performed easily. Secondly, high adhesion to matrix resin of CFRP core 3 can be obtained by anchoring of copper foil 3c. Thirdly, high adhesion to the first adhesive member 4a can be obtained by roughening an exposed surface of CFRP core 3 after coating layer 3b is patterned. Fourthly, copper foil 3c of the double-sided copper clad board is in close contact with the matrix resin of CFRP core 3, and the carbon fiber is not exposed even after the patterning, suppressing falling off of carbon powders from the surface of CFRP core 3.

Further, since adhesion between the carbon fiber and the matrix resin is low and exfoliation is likely to occur in an interface, it is preferable to use a cross material, rather than a laminated body of unidirectional materials, as the carbon fiber forming CFRP core 3.

Figure 24:
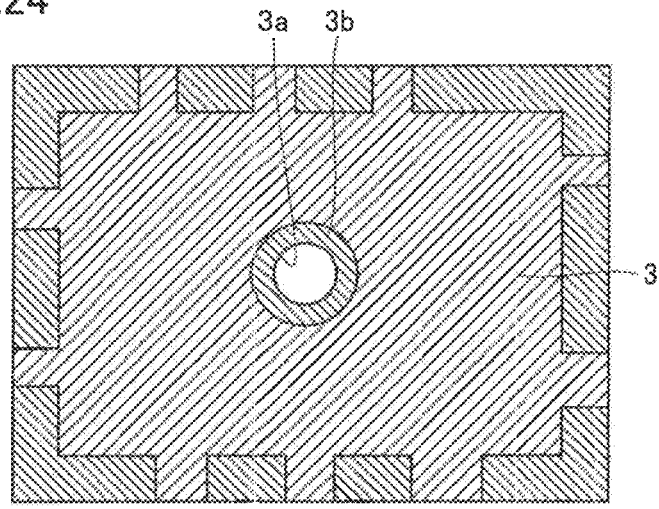
FIG. 24 is a plan view schematically showing a configuration after patterning is performed on a CFRP core of the printed wiring board in Embodiment 1 of the present invention.

Preferably, the frame (periphery) of CFRP core 3 is formed as shown in FIG. 24. Specifically, it is preferable to make slits appropriately such that coating layer 3b does not remain all over the frame, in order to relax a difference in the coefficients of thermal expansion of CFRP core 3 and coating layer 3b.

Figure 7:
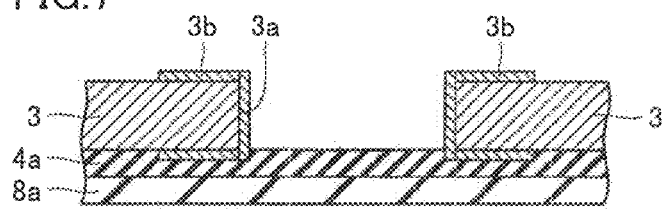
FIG. 7 is a schematic cross sectional view showing the method of manufacturing the printed wiring board in Embodiment 1 of the present invention in the order of steps.

Next, as shown in FIG. 7, the first adhesive member 4a is formed on a lower surface of the CFRP core to cover primary through hole 3a. The first adhesive member 4a can be made of, for example, the materials described above, and preferably includes an inorganic filler.

In this step, as shown for example in FIG. 7, the first adhesive member 4a made of a prepreg including glass cloth having a mold releasing film 8a bonded on one surface thereof is prepared, and temporarily pressure-bonded on the lower surface of CFRP core 3 by vacuum lamination under predetermined conditions. It is to be noted that, although vacuum lamination is used as a method of performing temporary pressure bonding in the present embodiment, the present invention is not particularly limited thereto, and temporary pressure bonding may be performed, for example, by vacuum pressing.

Figure 8:
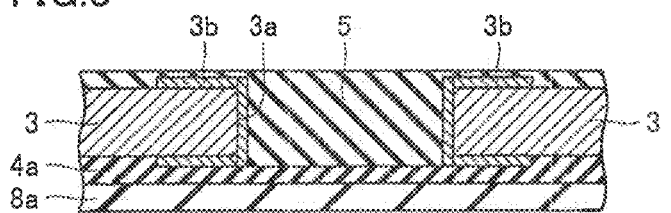
FIG. 8 is a schematic cross sectional view showing the method of manufacturing the printed wiring board in Embodiment 1 of the present invention in the order of steps.

Subsequently, as shown in FIG. 8, insulating resin 5 is charged into primary through hole 3a. Insulating resin 5 can be made of, for example, the materials described above, and preferably includes an inorganic filler.

In this step, for example, inorganic filler-containing paste is charged by printing. Since a bottom is provided beforehand by the first adhesive member 4a and mold releasing film 8a, the paste can be suppressed from dropping from primary through hole 3a even if primary through hole 3a has a large diameter or is a long hole (slit).

Figure 34:
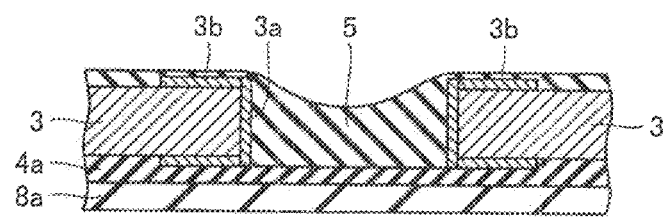
FIG. 34 is a schematic cross sectional view showing the method of manufacturing the printed wiring board in Embodiment 1 of the present invention in the order of steps.

Here, in this step, if the paste is charged by screen printing or the like, a depression occurs as shown in FIG. 34. Although the amount of depression is small when primary through hole 3a has a small diameter, a significant depression occurs when primary through hole 3a has a large diameter. If lamination is performed in this state, the second adhesive member 4b is charged into a depressed portion. In the case of Embodiment 1, that is, in the case of using an ordinary prepreg as the second adhesive member 4b, only resin having a coefficient of thermal expansion of 60 ppm/K is charged into the depressed portion. Thus, a crack may occur during heat cycles due to a difference in the coefficients of thermal expansion of CFRP core 3 and the second adhesive member 4b. In order not to cause the above problem, it is important to charge the paste with less amount of depression. However, as described above, if primary through hole 3a has a large diameter, there may be a case where single charging is insufficient to reduce the amount of depression. In that case, the charging step may be performed a plurality of times from an identical surface. Alternatively, the step of temporarily drying and curing resin may be performed after the charging step, and then another charging step may be performed.

Further, in this step, since the carbon fiber in the wall surface of primary through hole 3a provided in CFRP core 3 is coated with coating layer 3b, carbon powders can be suppressed from mixing into insulating resin 5.

Figure 9:
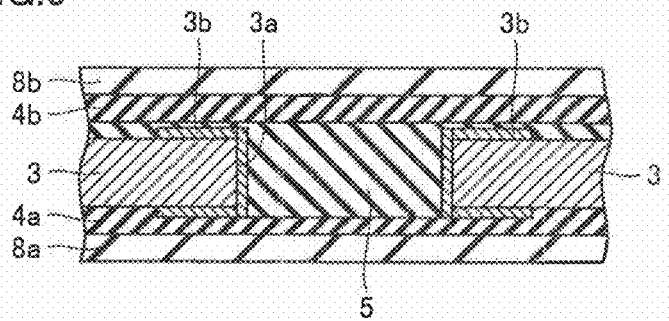
FIG. 9 is a schematic cross sectional view showing the method of manufacturing the printed wiring board in Embodiment 1 of the present invention in the order of steps.

Next, as shown in FIG. 9, the second adhesive member 4b is formed on an upper surface of CFRP core 3. The second adhesive member 4b can be made of, for example, the materials described above, and is preferably a prepreg including glass cloth. Further, the second adhesive member 4b is preferably made of the same material as that for the first adhesive member 4a.

Figure 10:
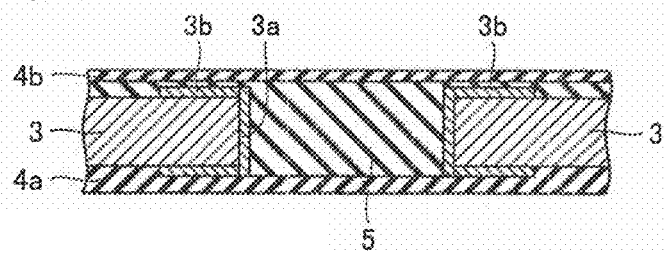
FIG. 10 is a schematic cross sectional view showing the method of manufacturing the printed wiring board in Embodiment 1 of the present invention in the order of steps.

In this step, the second adhesive member 4b made of a prepreg including glass cloth having a mold releasing film 8b bonded on one surface thereof is temporarily pressure-bonded by vacuum lamination under predetermined conditions. Thereafter, as shown in FIG. 10, mold releasing films 8a, 8b on the first and second adhesive members 4a, 4b are removed.

Figure 11:
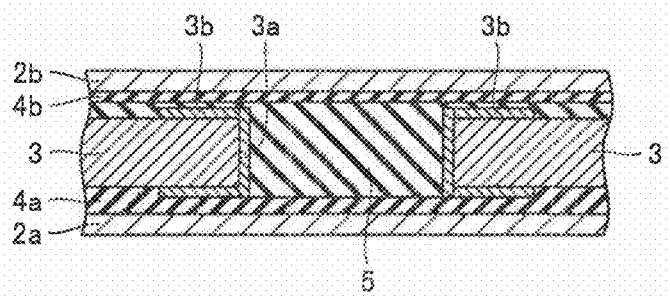
FIG. 11 is a schematic cross sectional view showing the method of manufacturing the printed wiring board in Embodiment 1 of the present invention in the order of steps.

Then, as shown in FIG. 11, signal circuit layers 2a, 2b having interconnections are formed on CFRP core 3. Specifically, for example, copper foil forming signal circuit layers 2a, 2b is prepared, and laminated to come into contact with the first and second adhesive members 4a, 4b using vacuum pressing under predetermined conditions. On this occasion, the first and second adhesive members 4a, 4b and insulating resin 5 are cured.

In this step, since insulating resin 5 is charged in primary through hole 3a beforehand, it is not necessary to charge the insulating resin at the time of lamination as is conventionally required. Thus, the copper foil can be laminated using a pressure for an ordinary laminated board of about 20 kg/cm². Since internal stress can be reduced due to a low lamination pressure, occurrence of a crack during cooling can be suppressed. Therefore, the method of charging insulating resin 5 according to the present embodiment also has an effect of improving reliability.

Figure 12:
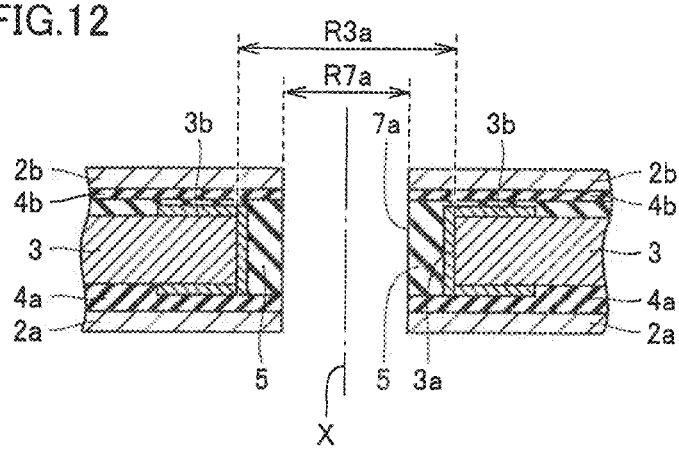
FIG. 12 is a schematic cross sectional view showing the method of manufacturing the printed wiring board in Embodiment 1 of the present invention in the order of steps.

Subsequently, as shown in FIG. 12, secondary through hole 7a having a diameter smaller than that of primary through hole 3a is formed coaxially with primary through hole 3a (i.e., on an axis X in FIG. 12). Secondary through hole 7a has a diameter R7a, and primary through hole 3a has a diameter R3a. Further, the axis of secondary through hole 7a may be different from the axis of primary through hole 3a.

Figure 13:
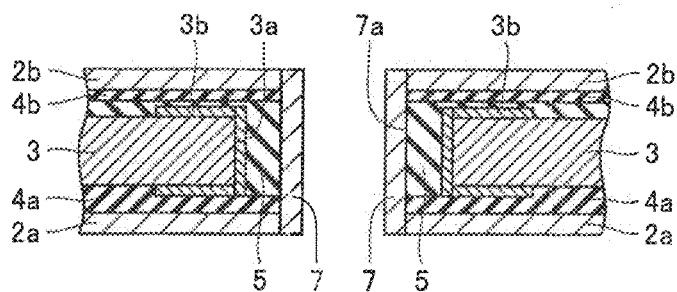
FIG. 13 is a schematic cross sectional view showing the method of manufacturing the printed wiring board in Embodiment 1 of the present invention in the order of steps.

Thereafter, as shown in FIG. 13, plating such as copper plating is performed to form an electrically conductive layer on secondary through hole 7a. Then, as shown in FIG. 1, signal circuit layers 2a, 2b are patterned to form interconnections. Thereafter, solder resist coating, solder coating by gas leveling treatment, and contour cutting are performed.

By performing the above steps, printed wiring board 1 shown in FIG. 1 can be manufactured.

Next, the effect of the method of manufacturing printed wiring board 1 in the present embodiment will be described in comparison with a conventional method of manufacturing a printed wiring board by a lamination technique.

In the conventional method of manufacturing a printed wiring board by the lamination technique, an adhesive member is laminated on each of upper and lower surfaces of a CFRP core, and then the adhesive member is melted to be charged into a primary through hole. In the case where the adhesive member includes glass cloth, if the primary through hole has a depth of 0.5 mm and the adhesive member disposed on each of the upper and lower surfaces has a thickness of 0.1 mm, a void occurs in the adhesive member charged in the primary through hole.

Further, if the adhesive member includes a filler, the adhesive member has an increased viscosity. In the case where the adhesive member has a viscosity of about 30000 Pa·s, if the adhesive member disposed on each of the upper and lower surfaces has a thickness of about 0.5 mm, occurrence of a void in the adhesive member charged in the primary through hole can be suppressed. Thus, even if the adhesive member is charged into the primary through hole by applying lamination pressure, the printed wiring board has an increased thickness. It is to be noted that filler-containing resin having a thermal conductivity of about 3 W/m·K and a melt viscosity of not more than several thousand Pa·s is difficult to obtain. Therefore, in order to charge insulating resin (the adhesive member) into the primary through hole so as not to cause a void, an adhesive member with a thickness comparable to or greater than that of the CFRP core has been required.

In contrast, the method of manufacturing printed wiring board 1 in the present embodiment includes the steps of forming CFRP core 3 having primary through hole 3a, forming the first adhesive member 4a on the lower surface of CFRP core 3 to cover primary through hole 3a, charging insulating resin 5 into primary through hole 3a, forming the second adhesive member 4b on the upper surface of CFRP core 3, and forming signal circuit layers 2a, 2b on CFRP core 3.

According to the method of manufacturing printed wiring board 1 in the present embodiment, insulating resin 5 can be charged using the first adhesive member 4a formed on the lower surface of CFRP core 3 as a bottom, and thus insulating resin 5 can be charged in advance before lamination pressure is applied. Hence, the first and second adhesive members 4a, 4b are required to have only a thickness necessary to serve as a bottom and a lid, and they are not required to have a thickness determined by considering conditions for melting of the adhesive member and the like as is conventionally required. That is, even if the first and second adhesive members 4a, 4b have a thickness smaller than that of CFRP core 3, printed wiring board 1 with no voids can be manufactured.

Further, since insulating resin 5 to be charged into primary through hole 3a can be charged with less thickness irrespective of its properties such as viscosity, insulating resin 5 having a high thermal conductivity can be used. In addition, since the first and second adhesive members 4a, 4b and insulating resin 5 have reduced thicknesses, printed wiring board 1 having an improved heat dissipation property can be manufactured.

Preferably, in the method of manufacturing printed wiring board 1 described above, insulating resin 5 includes an inorganic filler. Thereby, stress between CFRP core 3 and penetrating through hole 7 can be relaxed, and printed wiring board 1 improving thermal conduction can be manufactured.

Preferably, in the method of manufacturing printed wiring board 1 described above, the step of forming the first adhesive member 4a includes the step of forming coating layer 3b to coat the wall surface of primary through hole 3a. This can suppress carbon powders of the carbon fiber of CFRP core 3 from mixing into insulating resin 5.

Further, printed wiring board 1 in the present embodiment is manufactured by the method of manufacturing printed wiring board 1 described above. Therefore, printed wiring board 1 having a reduced thickness and an improved heat dissipation property can be implemented.

Embodiment 2

Figure 14:
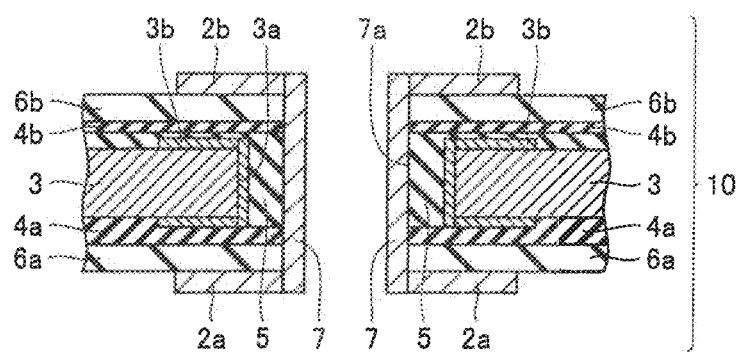
FIG. 14 is a cross sectional view schematically showing a configuration of a printed wiring board in Embodiment 2 of the present invention.

FIG. 14 is a cross sectional view schematically showing a configuration of a printed wiring board in Embodiment 2 of the present invention. As shown in FIG. 14, although a printed wiring board 10 in the present embodiment basically has a configuration similar to that of printed wiring board 1 in Embodiment 1, it is different in that it further includes third and fourth adhesive members 6a, 6b.

Specifically, the third and fourth adhesive members 6a, 6b are provided between the first and second adhesive members 4a, 4b and signal circuit layers 2a, 2b, respectively. Preferably, the first and second adhesive members 4a, 4b are made of, for example, an inorganic filler and resin, and has a thermal conductivity of 1 to 15 W/(m·K).

The third and fourth adhesive members 6a, 6b are made of, for example, a material produced by curing a prepreg prepared by impregnating glass cloth with epoxy resin or the like. The third and fourth adhesive members 6a, 6b may be made of different materials or the same material. Preferably, the third and fourth adhesive members 6a, 6b are made of the same material, as stress such as warpage can be relaxed by employing a symmetric structure.

Figure 15:
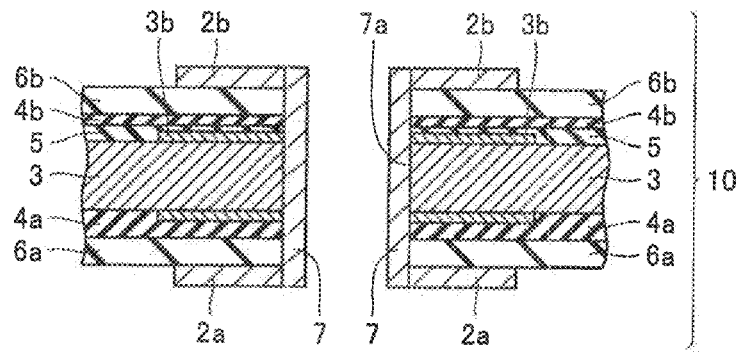
FIG. 15 is a cross sectional view schematically showing a configuration different from that of the printed wiring board in Embodiment 2 of the present invention.

FIG. 15 is a cross sectional view schematically showing a configuration different from that of the printed wiring board in Embodiment 2 of the present invention. If penetrating through hole 7 is not handled as a signal line, the primary through hole is not formed and a short circuit is established between CFRP core 3 and penetrating through hole 7, as shown in FIG. 15.

Subsequently, a method of manufacturing printed wiring board 10 in the present embodiment will be described. FIGS. 16 to 19 are schematic cross sectional views showing a method of manufacturing the printed wiring board in Embodiment 2 of the present invention in the order of steps.

Although the method of manufacturing printed wiring board 10 in the present embodiment basically has a configuration similar to that in Embodiment 1, it is different in that it further includes the step of forming the third and fourth adhesive members 6a, 6b.

Firstly, as shown in FIGS. 3 to 10, the steps of forming CFRP core 3 having primary through hole 3a, forming the first adhesive member 4a on the lower surface of CFRP core 3 to cover primary through hole 3a, charging insulating resin 5 into primary through hole 3a, and forming the second adhesive member 4b on the upper surface of CFRP core 3 are performed. Since these steps are identical to those in Embodiment 1, the description thereof will not be repeated.

Figure 16:
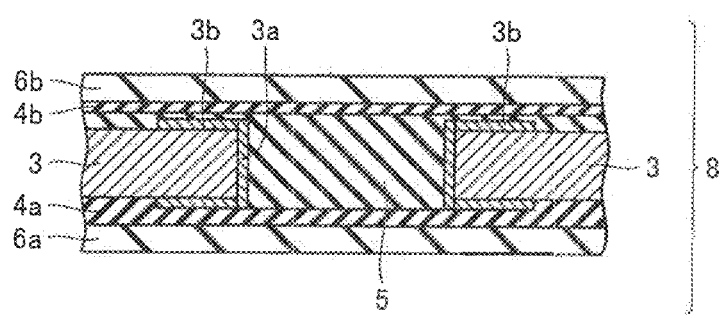
FIG. 16 is a schematic cross sectional view showing a method of manufacturing the printed wiring board in Embodiment 2 of the present invention in the order of steps.
Figure 17:
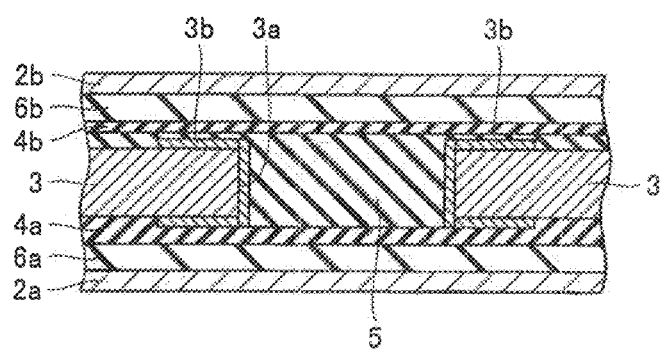
FIG. 17 is a schematic cross sectional view showing the method of manufacturing the printed wiring board in Embodiment 2 of the present invention in the order of steps.

Next, as shown in FIG. 16, the third and fourth adhesive members 6a, 6b in a semi-cured state are prepared, and temporarily pressure-bonded by vacuum lamination under predetermined conditions. Then, as shown in FIG. 17, copper foil is prepared, and laminated using vacuum pressing under predetermined conditions. On this occasion, the first to fourth adhesive members 4a, 4b, 6a, 6b and insulating resin 5 are cured.

Figure 18:
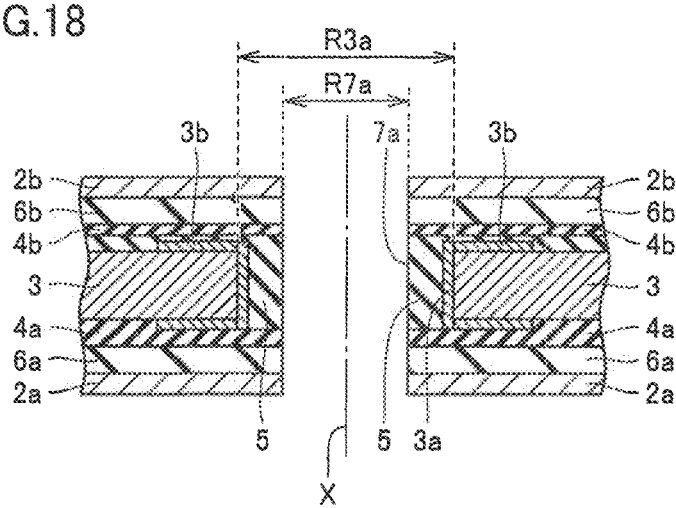
FIG. 18 is a schematic cross sectional view showing the method of manufacturing the printed wiring board in Embodiment 2 of the present invention in the order of steps.
Figure 19:
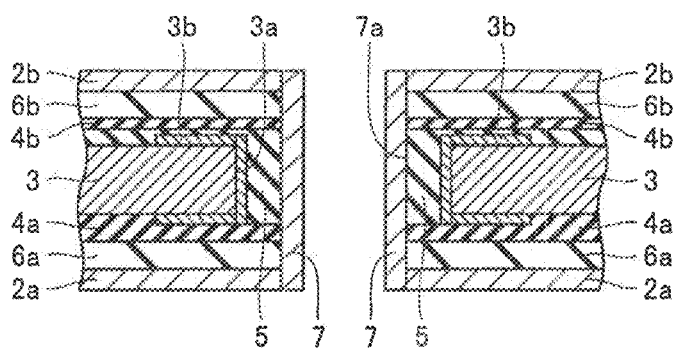
FIG. 19 is a schematic cross sectional view showing the method of manufacturing the printed wiring board in Embodiment 2 of the present invention in the order of steps.

Subsequently, as shown in FIG. 18, secondary through hole 7a having a smaller diameter is formed coaxially with primary through hole 3a (i.e., on axis X in FIG. 18). Next, as shown in FIG. 19, plating is performed to form an electrically conductive layer on secondary through hole 7a. Then, signal circuit layers 2a, 2b are patterned to form interconnections. Thereafter, solder resist coating, solder coating by gas leveling treatment, and contour cutting are performed.

By performing the above steps, printed wiring board 10 in the present embodiment shown in FIG. 14 can be manufactured.

The method of manufacturing printed wiring board 10 in the present embodiment further includes the steps of forming the third adhesive member 6a below the first adhesive member 4a, and forming the fourth adhesive member 6b on the second adhesive member 4b.

Since the third and fourth adhesive members 6a, 6b prevent the first and second adhesive members 4a, 4b from being exposed to the outermost surfaces of printed wiring board 10, occurrence of a crack can be suppressed.

Preferably, in the method of manufacturing printed wiring board 10 described above, the third and fourth adhesive members 6a, 6b include glass cloth. Thereby, printed wiring board 10 capable of effectively suppressing occurrence of a crack can be manufactured.

Embodiment 3

Figure 20:
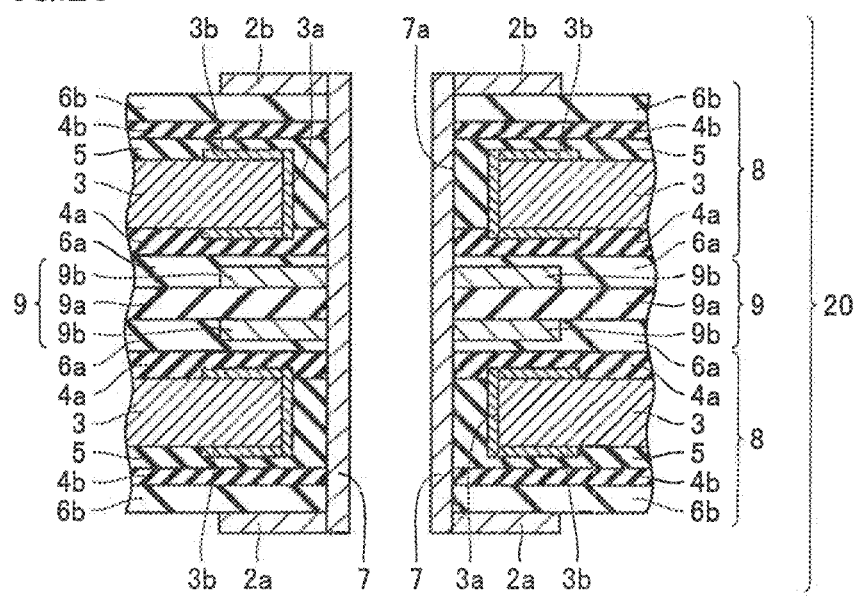
FIG. 20 is a cross sectional view schematically showing a configuration of a printed wiring board in Embodiment 3 of the present invention.

FIG. 20 is a cross sectional view schematically showing a configuration of a printed wiring board in Embodiment 3 of the present invention. As shown in FIG. 20, although a printed wiring board 20 in the present embodiment basically has a configuration similar to that of printed wiring board 10 in Embodiment 2, it is different in that it is a multi-layer printed wiring board. Printed wiring board 20 in the present embodiment is a four-layer board using a laminated body 8 shown in FIG. 16.

Specifically, printed wiring board 20 includes signal circuit layers 2a and 2b, laminated bodies 8, and a two-layer board 9. Two-layer board 9 has an insulating base material 9a, and signal interconnections 9b formed on surfaces of insulating base material 9a. Insulating base material 9a is made of, for example, a material produced by curing a prepreg prepared by impregnating glass cloth with epoxy resin or the like. Signal interconnection 9b is made of, for example, copper. Laminated bodies 8 are each formed on upper and lower surfaces of two-layer board 9. Signal interconnections 9b are electrically connected with signal circuit layers 2a, 2b, and electrical insulation is established between signal interconnections 9b and signal circuit layers 2a, 2b, by insulating base material 9a, the first to fourth adhesive members 4a, 4b, 6a, 6b, insulating resin 5, and the like. Signal circuit layers 2a, 2b are formed on upper and lower surfaces of laminated bodies 8.

Figure 21:
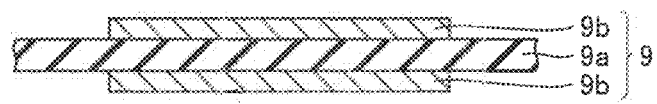
FIG. 21 is a schematic cross sectional view showing a method of manufacturing the printed wiring board in Embodiment 3 of the present invention in the order of steps.
Figure 22:
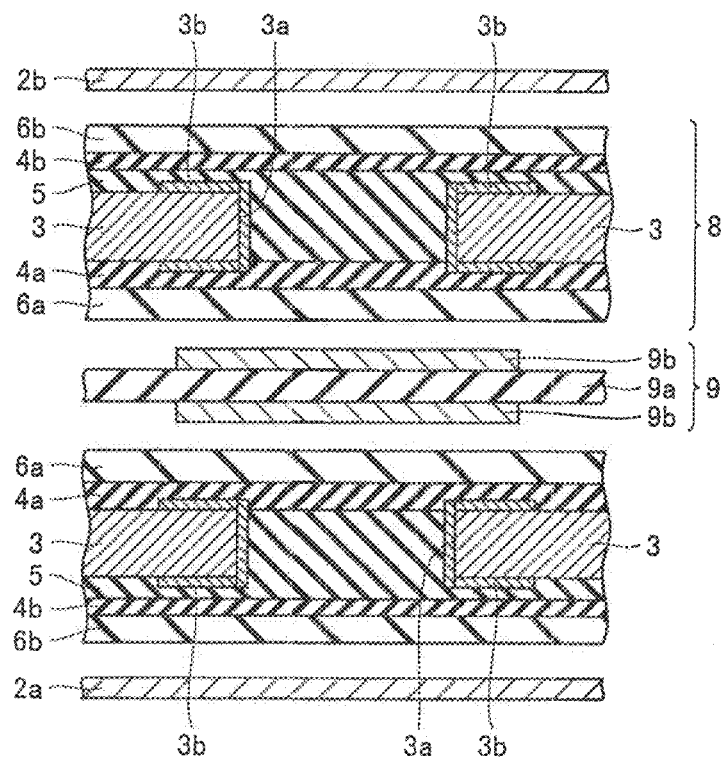
FIG. 22 is a schematic cross sectional view showing the method of manufacturing the printed wiring board in Embodiment 3 of the present invention in the order of steps.
Figure 23:
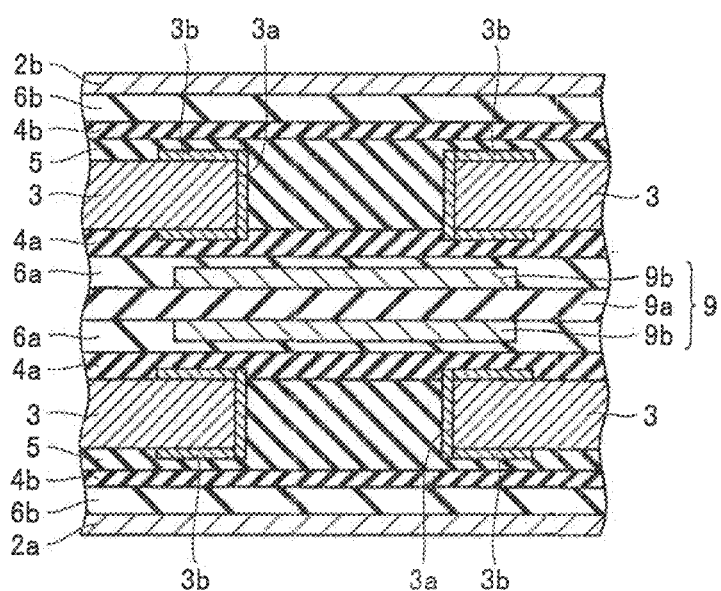
FIG. 23 is a schematic cross sectional view showing the method of manufacturing the printed wiring board in Embodiment 3 of the present invention in the order of steps.

Subsequently, a method of manufacturing the printed wiring board in the present embodiment will be described. FIGS. 21 to 23 are schematic cross sectional views showing a method of manufacturing the printed wiring board in Embodiment 3 of the present invention in the order of steps.

Although the method of manufacturing printed wiring board 20 in the present embodiment basically has a configuration similar to that in Embodiment 2, it is different in that multi-layer printed wiring board 20 is manufactured. Specifically, in Embodiment 2, the case where laminated body 8 shown in FIG. 16 is formed, and thereafter copper foil is placed and laminated on and below laminated body 8 has been described. In contrast, in the present embodiment, a four-layer board is manufactured using laminated body 8 shown in FIG. 16.

Firstly, two laminated bodies 8 shown in FIG. 16 of Embodiment 2 are prepared. Since this step is identical to that in Embodiment 2, the description thereof will not be repeated.

Next, as shown in FIG. 21, two-layer board 9 having insulating base material 9a and signal interconnections 9b formed on upper and lower surfaces of insulating base material 9a is prepared. Signal interconnections 9b of two-layer board 9 are patterned.

Subsequently, a reference hole and a lamination pin hole (not shown) are formed in laminated body 8 and two-layer board 9. Although the first and second adhesive members 4a, 4b, the third and fourth adhesive members 6a, 6b, and insulating resin 5 of laminated body 8 are all in an uncured state, if glass cloth is included in the third and fourth adhesive members 6a, 6b, the reference hole and the lamination pin hole can be formed without causing a fracture.

Next, as shown in FIG. 22, signal circuit layer 2a, laminated body 8, two-layer board 9, laminated body 8, and signal circuit layer 2b are laminated from the bottom in this order. It is to be noted that, since one laminated body 8 has a structure substantially symmetrical in the vertical direction, the direction of laminating two laminated bodies 8 (i.e., the vertical direction of adhesive members 4a, 4b) is not particularly limited. Then, a pin is inserted into the lamination pin hole to prevent misalignment of each layer.

Subsequently, pressure and heat are applied under predetermined conditions to obtain a laminated body as shown in FIG. 23. Thereafter, as in Embodiment 2, hole drilling, plating, patterning, solder resist coating, solder coating by gas leveling treatment, and contour cutting are performed.

By performing the above steps, printed wiring board 20 as a four-layer board as shown in FIG. 20 can be manufactured. It is to be noted that, although laminated body 8 including the first to fourth adhesive members 4a, 4b, 6a, 6b of Embodiment 2 shown in FIG. 16 is used in the present embodiment, the present invention is not particularly limited thereto, and a laminated body including the first and second adhesive members 4a, 4b of Embodiment 1 shown in FIG. 10 may be used.

The method of manufacturing printed wiring board 20 in the present embodiment includes the steps of: forming laminated body 8 having the first to fourth adhesive members 4a, 4b, 6a, 6b; laminating one laminated body 8 and another laminated body 8, by forming a positioning hole in the one laminated body 8 when the first to fourth adhesive members 4a, 4b, 6a, 6b are in an uncured state, and inserting a positioning member into the positioning hole to perform positioning; and forming signal circuit layers 2a, 2b on laminated bodies 8. The step of forming laminated body 8 includes the steps of forming CFRP core 3 having primary through hole 3a, temporarily pressure-bonding the first adhesive member 4a on the lower surface of CFRP core 3, charging insulating resin 5 into primary through hole 3a, temporarily pressure-bonding the second adhesive member 4b on the upper surface of CFRP core 3, temporarily pressure-bonding the third adhesive member 6a on a lower surface of the first adhesive member 4a, and temporarily pressure-bonding the fourth adhesive member 6b on an upper surface of the second adhesive member 4b.

With the method of manufacturing the printed wiring board in the present embodiment, insulating resin 5 can also be charged using the first adhesive member 4a as a bottom as in Embodiments 1 and 2, and thus printed wiring board 20 having a reduced thickness and an improved heat dissipation property can be manufactured.

Although two-layer board 9 is used as an internal layer in the present embodiment, it is not limited to two layers. For example, if a four-layer board is used instead of two-layer board 9, a printed wiring board as a six-layer board can be obtained.

In this lamination method, since laminated body 8 is not cured beforehand, the number of lamination can be minimized. Further, this lamination method has an advantage that laminated body 8 is subjected to lamination stress only once. If laminated body 8 is cured, a crack occurs during the second cooling step due to residual stress caused by cure shrinkage. This lamination method also has an advantage that conductivity of heat from a component to CFRP core 3 is not changed even if multi-layering is further performed, by dealing with the multi-layering by increasing the number of layers in two-layer board 9.

Embodiment 4

Figure 25:
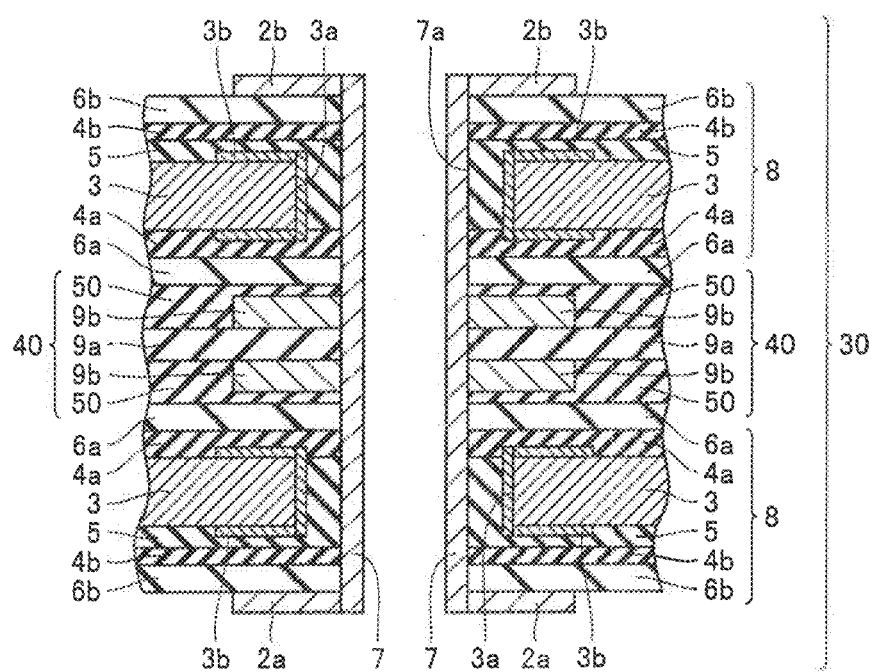
FIG. 25 is a cross sectional view schematically showing a configuration of a printed wiring board in Embodiment 4 of the present invention.

FIG. 25 is a cross sectional view schematically showing a configuration of a printed wiring board in Embodiment 4 of the present invention. As shown in FIG. 25, although a printed wiring board 30 in the present embodiment basically has a configuration similar to that of printed wiring board 20 in Embodiment 3, it is different in that signal interconnections 9b of printed wiring board 30 have a larger thickness.

Specifically, printed wiring board 30 includes signal circuit layers 2a and 2b, laminated bodies 8, and a two-layer board 40. Two-layer board 40 has insulating base materials 9a and 50, and signal interconnections 9b. Signal interconnections 9b are each formed on the upper and lower surfaces of insulating base material 9a. Insulating base materials 50 are each formed to cover signal interconnection 9b.

Insulating base materials 9a and 50 are made of, for example, a material produced by curing a prepreg prepared by impregnating glass cloth with epoxy resin or the like. Signal interconnection 9b is made of, for example, copper, and has a thickness of, for example, not less than 35 μm. Laminated bodies 8 are each formed on upper and lower surfaces of two-layer board 40.

Signal interconnections 9b are electrically connected with signal circuit layers 2a, 2b. Electrical insulation is established between signal interconnections 9b and signal circuit layers 2a, 2b, by insulating base material 9a, the first to fourth adhesive members 4a, 4b, 6a, 6b, insulating resins 5 and 50, and the like.

Subsequently, a method of manufacturing the printed wiring board in the present embodiment will be described. FIGS. 26 to 29 are schematic cross sectional views showing a method of manufacturing the printed wiring board in Embodiment 4 of the present invention in the order of steps.

Although the method of manufacturing printed wiring board 30 in the present embodiment basically has a configuration similar to that in Embodiment 3, it is different in that two-layer board 40 is manufactured. Specifically, in Embodiment 3, the case where two-layer board 9 is placed to perform lamination has been described. In contrast, in the present embodiment, a four-layer board is manufactured using two-layer board 40 in which internal layer patterns (signal interconnections 9b) are planarized.

Firstly, two laminated bodies 8 shown in FIG. 16 of Embodiment 2 are prepared. Since this step is identical to that in Embodiment 2, the description thereof will not be repeated.

Figure 26:
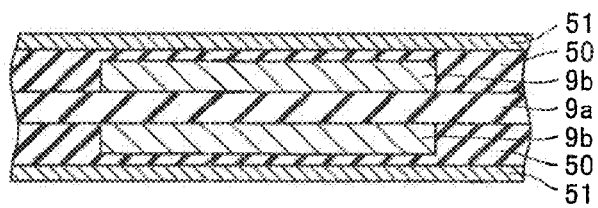
FIG. 26 is a cross sectional view showing a method of manufacturing the printed wiring board in Embodiment 4 of the present invention in the order of steps.
Figure 27:
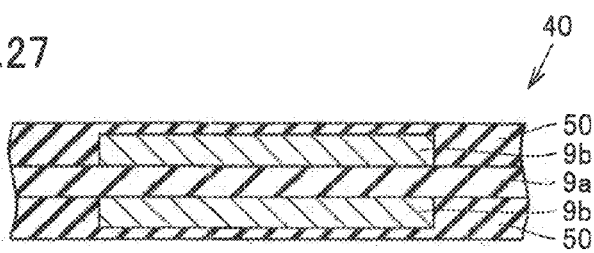
FIG. 27 is a cross sectional view showing the method of manufacturing the printed wiring board in Embodiment 4 of the present invention in the order of steps.

Next, as shown in FIG. 21, two-layer board 9 having insulating base material 9a and signal interconnections 9b formed on the upper and lower surfaces of insulating base material 9a is prepared. In the present embodiment, however, signal interconnection 9b has a thickness larger than that of signal interconnection 9b in Embodiment 3. Further, signal interconnections 9b of two-layer board 9 are patterned. Then, as shown in FIG. 26, insulating base material 50 and copper foil 51 are laminated on two-layer board 9. On this occasion, insulating base material 50 is formed to cover signal interconnection 9b. Thereafter, as shown in FIG. 27, copper foil 51 is etched entirely to obtain two-layer board 40. Thereby, two-layer board 40 as a multi-layer board having planarized surfaces can be manufactured.

Here, insulating base material 50 is formed by covering signal interconnection 9b with a prepreg sheet and curing the prepreg sheet. Further, insulating base material 50 is formed by being temporarily pressure-bonded by vacuum lamination. Preferably, insulating base material 50 is formed by curing, as it is possible to fix a positioning pin satisfactorily. For example, if signal interconnection 9b has a thickness of 35 μm, a prepreg sheet of about 60 μm is disposed, and if signal interconnection 9b has a thickness of 70 μm, a prepreg sheet of about 100 μm is disposed.

Subsequently, as in Embodiment 3, a reference hole and a lamination pin hole (not shown) are formed in laminated body 8 and two-layer board 40.

Figure 28:
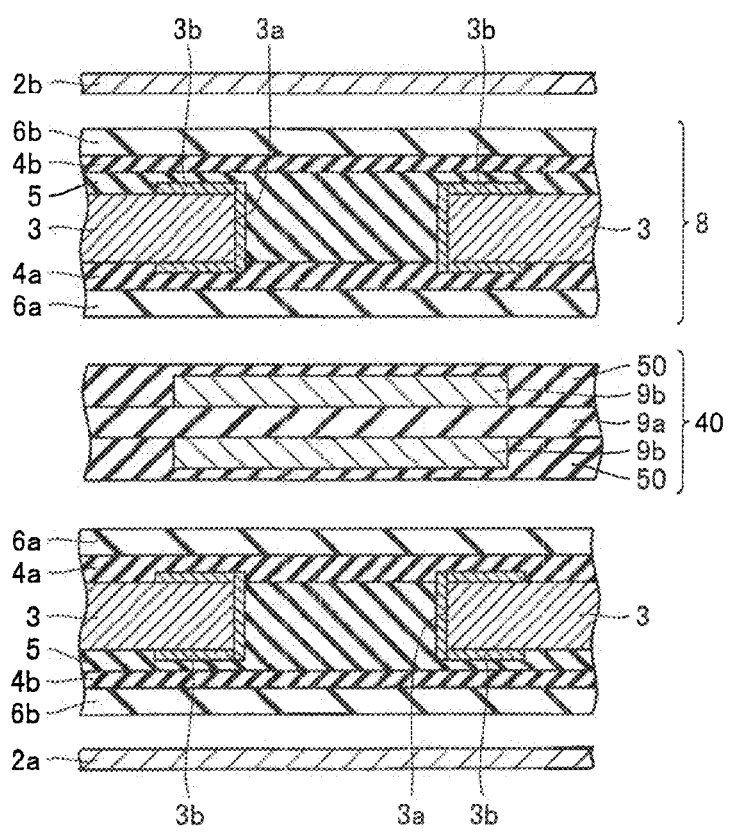
FIG. 28 is a cross sectional view showing the method of manufacturing the printed wiring board in Embodiment 4 of the present invention in the order of steps.

Next, as shown in FIG. 28, signal circuit layer 2a, laminated body 8, two-layer board 40, laminated body 8, and signal circuit layer 2b are laminated from the bottom in this order.

Figure 29:
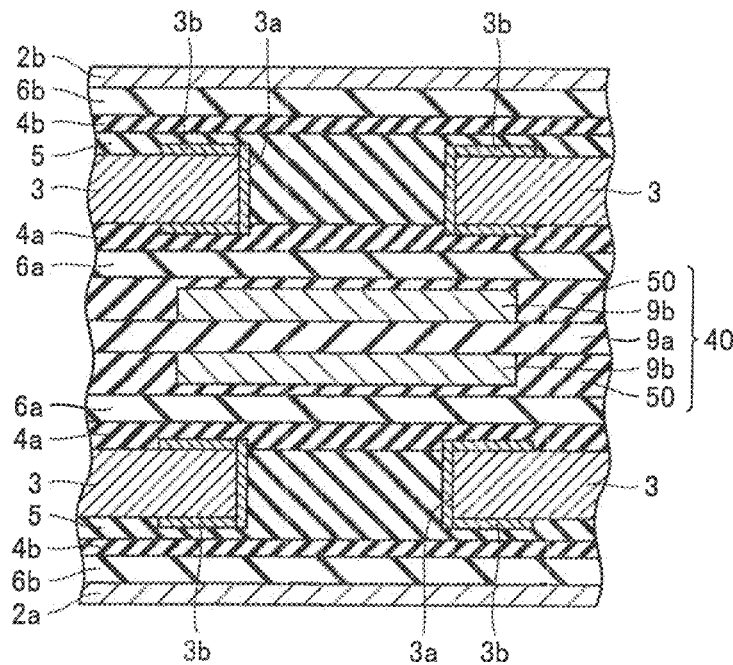
FIG. 29 is a cross sectional view showing the method of manufacturing the printed wiring board in Embodiment 4 of the present invention in the order of steps.
Figure 30:
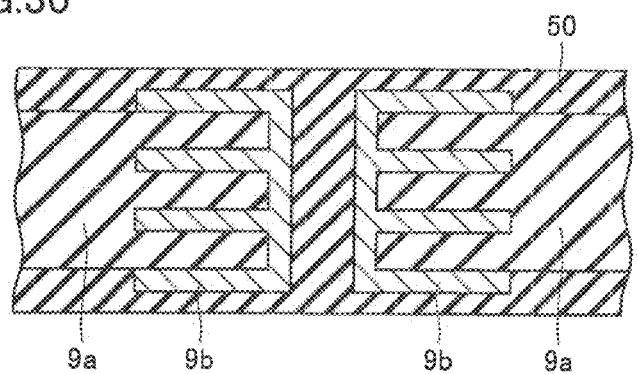
FIG. 30 is a cross sectional view schematically showing a configuration of an internal layer (a multi-layer board) of the printed wiring board in Embodiment 4 of the present invention.
Figure 31:
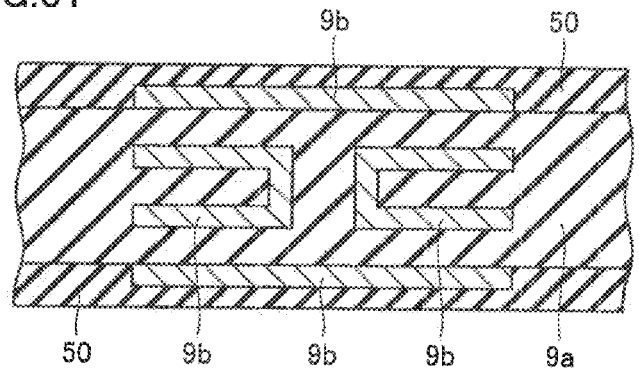
FIG. 31 is a cross sectional view schematically showing a configuration of the internal layer (multi-layer board) of the printed wiring board in Embodiment 4 of the present invention.

Subsequently, pressure and heat are applied under predetermined conditions to obtain a laminated body as shown in FIG. 29. Thereafter, as in Embodiment 3, hole drilling, plating, patterning, solder resist coating, solder coating by gas leveling treatment, and contour cutting are performed.

By performing the above steps, printed wiring board 30 as a four-layer board as shown in FIG. 25 can be manufactured.

In the method of manufacturing the printed wiring board in the present embodiment, as shown in FIGS. 26 to 29, in the step of laminating, two-layer board 40 having insulating base material 9a, signal interconnections 9b formed on both surfaces of insulating base material 9a, and insulating base materials 50 covering signal interconnections 9b is disposed between two laminated bodies 8. With the method of manufacturing the printed wiring board in the present embodiment, insulating resin 5 can also be charged using the first adhesive member 4a as a bottom as in Embodiments 1 and 2, and thus printed wiring board 30 having a reduced thickness and an improved heat dissipation property can be manufactured.

Further, in the lamination method in the present embodiment, since a step difference of signal interconnection 9b of two-layer board 9 is planarized beforehand by covering entire signal interconnection 9b with insulating base material 50, there is no need to increase lamination pressure to reduce the step difference of signal interconnection 9b, even if signal interconnection 9b has a large thickness. Therefore, the lamination method suppresses breaking of CFRP core 3 and occurrence of a crack during a heat cycle test and the like due to residual stress caused by cure shrinkage.

Although two-layer board 9 is used as an internal layer in the present embodiment, it is not limited to two layers. For example, if a four-layer board is used instead of two-layer board 9, a printed wiring board as a six-layer board can be obtained.

Further, the internal layer is not limited to two-layer board 9, and an internal layer core as shown for example in FIGS. 30 to 33 may be used. In particular, in the case where there is an internal layer connection, copper plating or the like is performed, and signal interconnection 9b has a large step difference (i.e., signal interconnection 9b has a large thickness), it is preferable to suppress the step difference by performing soft etching before forming copper foil 51.

Figure 32:
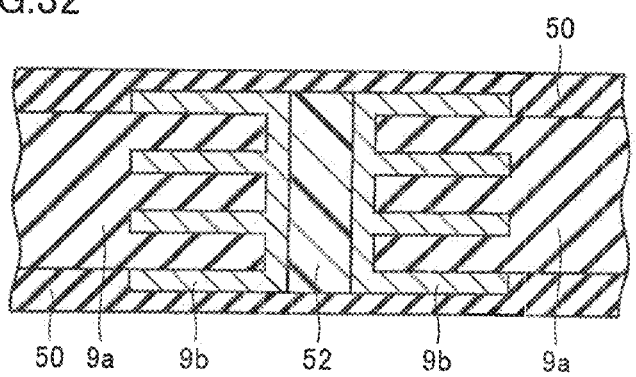
FIG. 32 is a cross sectional view schematically showing a configuration of the internal layer (multi-layer board) of the printed wiring board in Embodiment 4 of the present invention.
Figure 33:
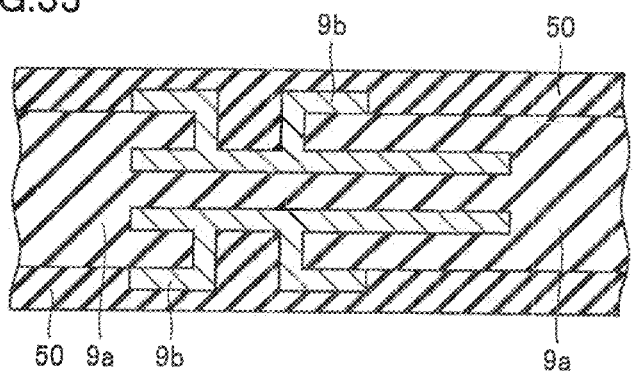
FIG. 33 is a cross sectional view schematically showing a configuration of the internal layer (multi-layer board) of the printed wiring board in Embodiment 4 of the present invention.

It is to be noted that, in FIG. 32, resin 52 printed beforehand is charged between signal interconnections 9b. Further, in FIG. 33, a laser via is formed.

EXAMPLES

Hereinafter, examples will be described to provide more detailed description.

Example 1

Example 1 was performed basically in accordance with the method of manufacturing printed wiring board 10 in Embodiment 2 described above.

Specifically, firstly, CFRP core 3 (thickness: 0.5 mm, size: 340 mm×250 mm) having a prepreg including carbon fiber (a cross material) with a thermal conductivity of 500 W/(m·K) and 18 μm-thick copper foil 3c laminated on the prepreg was prepared (see FIG. 3).

Next, a hole was drilled in CFRP core 3 to provide primary through hole 3a with a diameter of 1.5 mm (see FIG. 4). On this occasion, carbon powders were dispersed from the wall surface of primary through hole 3a.

Subsequently, copper plating was performed on the side wall of primary through hole 3a (see FIG. 5). Thereby, coating layer 3b was formed on the wall surface of primary through hole 3a, preventing dispersion of carbon powders from the wall surface.

Next, an unnecessary portion of coating layer 3b was removed by patterning (see FIG. 6). Thereby, copper was removed from the surfaces of CFRP core 3, and the surfaces of CFRP core 3 were exposed. However, at the exposed portion of CFRP core 3, resin playing a role to adhere to copper foil 3c at the time of lamination was present, and thus carbon powders were not dispersed. CFRP core 3 has a low coefficient of thermal expansion of ±0 ppm/° C., and if copper (coefficient of thermal expansion: 16 ppm/° C.) is provided all over the surfaces of CFRP core 3, stress due to a difference in the coefficients of thermal expansion is caused, and exfoliation may occur in an interface between CFRP core 3 and copper during a heat cycle test of a product.

Subsequently, a semi-cured highly thermally conductive resin sheet (thickness: 80 μm) having 50 μm-thick mold releasing films 8a attached on top and bottom surfaces thereof was prepared. The highly thermally conductive resin sheet as the first adhesive member 4a was made of an alumina filler and epoxy resin. After being cured, the highly thermally conductive resin sheet had a thermal conductivity of 3 W/(m·K) and a coefficient of thermal expansion of 30 ppm/° C. That is, it was resin having a higher thermal conductivity and a lower thermal expansion when compared with an ordinary resin.

Next, with mold releasing film 8a on one surface being peeled off, the highly thermally conductive resin sheet was vacuum laminated (see FIG. 7). The vacuum lamination was performed by vacuuming for one minute at 130° C., and then applying pressure at 10 kg/cm² for one minute.

Then, highly thermally conductive resin paste having a composition identical to that of the highly thermally conductive resin sheet was charged into primary through hole 3a by printing, using a squeegee (see FIG. 8). Since a bottom was provided beforehand by the highly thermally conductive resin sheet and mold releasing film 8a, the highly thermally conductive resin paste did not drop from primary through hole 3a.

Subsequently, a highly thermally conductive resin sheet as the second adhesive member 4b having mold releasing film 8b attached on one surface was vacuum laminated on a printed surface under identical conditions (see FIG. 9). Then, mold releasing films 8a, 8b on the both surfaces were peeled off (see FIG. 10).

Next, a glass epoxy prepreg of 60 µm was prepared as the third and fourth adhesive members 6a, 6b. As the prepreg, a prepreg named GEA-67N manufactured by Hitachi Chemical Co., Ltd., having a coefficient of thermal expansion of 13 to 16 ppm/° C. was used. The prepregs were vacuum laminated on the top and bottom surfaces of the highly thermally conductive resin sheets (see FIG. 16). The vacuum lamination was performed by vacuuming for 30 seconds at 100° C., and then applying pressure at 10 kg/cm² for 30 seconds. Thereby, laminated body 8 was obtained.

Subsequently, with 18 µm-thick copper foil being laminated, laminated body 8 was heated and pressurized using vacuum pressing under conditions of a temperature increasing rate of 5° C./minute, a holding time of one hour at 190° C., and a lamination pressure of 30 kg/cm² (see FIG. 17).

Next, secondary through hole 7a with a diameter of 0.9 mm was provided coaxially with primary through hole 3a with a diameter of 1.5 mm (i.e., on the X axis) (see FIG. 18). Then, copper plating was performed to form a copper layer on secondary through hole 7a (see FIG. 19). Subsequently, the copper foil was patterned. Next, solder resist coating and solder coating by gas leveling treatment were performed, and thereafter, contour cutting was performed. Thereby, printed wiring board 10 as shown in FIG. 14 was manufactured.

The obtained CFRP core substrate had a thickness of about 0.9 mm. In addition, when a cross section thereof was observed, no voids were found. Further, when a heat cycle test (−65° C. for 15 minutes ⇔ 125° C. for 15 minutes, 500 cycles) was conducted, no short circuit, break, and the like occurred, and no cracks, exfoliation, and the like were found. Furthermore, when a large-sized ceramic component (about 14 mm× about 18 mm× about 4 mm) was mounted on the core substrate described above and a heat cycle test (−30° C. for 15 minutes ⇔ 100° C. for 15 minutes, 500 cycles) was conducted, no crack occurred in a solder joint portion.

Example 2

Example 2 was performed basically in accordance with the method of manufacturing printed wiring board 20 in Embodiment 3 described above.

Specifically, laminated body 8 was obtained as in Example 1 (see FIGS. 16 and 22). Then, as two-layer board 9, a double-sided copper clad glass epoxy board (MCL-E-67N, t 0.2 mm-18/18 µm) was prepared, and copper of the copper clad board was patterned (see FIG. 21).

Next, a reference hole and a lamination pin hole were formed in laminated body 8 and two-layer board 9. On this occasion, since the prepregs including glass cloth were located at the surfaces of laminated body 8 and cured CFRP core 3 was located inside laminated body 8, the reference hole and the lamination pin hole were able to be formed without causing a fracture.

Subsequently, 18 µm-thick copper foil, laminated bodies 8, and two-layer board 9 made of low thermal expansion glass epoxy and having patterned copper layers were laminated, a pin was inserted into the lamination pin hole, and then heat and pressure were applied using vacuum pressing under conditions of a temperature increasing rate of 5° C./minute, a holding time of one hour at 190° C., and a lamination pressure of 30 kg/cm². Thereafter, the process identical to that in Example 1 was performed, and thus printed wiring board 20 as a four-layer board as shown in FIG. 20 was manufactured.

The obtained CFRP core substrate had a thickness of about 0.2 mm. In addition, when a cross section thereof was observed, no voids were found. Further, when a heat cycle test (−65° C. for 15 minutes ⇔ 125° C. for 15 minutes, 500 cycles) was conducted, no short circuit, break, and the like occurred, and no cracks, exfoliation, and the like were found. Furthermore, when a large-sized ceramic component (about 14 mm× about 18 mm× about 4 mm) was mounted on the core substrate described above and a heat cycle test (−30° C. for 15 minutes ⇔ 100° C. for 15 minutes, 500 cycles) was conducted, no crack occurred in a solder joint portion.

Example 3

Example 3 was performed basically in accordance with the method of manufacturing printed wiring board 30 in Embodiment 4 described above.

Specifically, laminated body 8 was obtained as in Example 2. Then, as two-layer board 9, a double-sided copper clad glass epoxy board (MCL-E-67N, t 0.2 mm-35/35 µm) was prepared, and copper of the copper clad board was patterned (see FIG. 21).

Thereafter, glass epoxy prepregs of 60 µm were disposed on top and bottom surfaces of two-layer board 9, and, with 18 µn copper foil being laminated, heat and pressure were applied using vacuum pressing under conditions of a temperature increasing rate of 5° C./minute, a holding time of one hour at 190° C., and a lamination pressure of 30 kg/cm². As the prepreg, a prepreg named GEA-67N manufactured by Hitachi Chemical Co., Ltd., having a coefficient of thermal expansion of 13 to 16 ppm/° C. was used. Then, the copper foil at the outermost layers was etched entirely to obtain two-layer board 40 (see FIG. 27).

Next, a reference hole and a lamination pin hole were formed in laminated body 8 and two-layer board 40. Thereafter, the process identical to that in Example 2 was performed, and thus printed wiring board 30 as a four-layer board as shown in FIG. 25 was manufactured.

The obtained CFRP core substrate had a thickness of about 2.2 mm. In addition, when a cross section thereof was observed, no voids were found. Further, when a heat cycle test (−65° C. for 15 minutes a ⇔ 125° C. for 15 minutes, 500 cycles) was conducted, no short circuit, break, and the like occurred, and no cracks, exfoliation, and the like were found. Furthermore, when a large-sized ceramic component (about 14 mm× about 18 mm× about 4 mm) was mounted on the core substrate described above and a heat cycle test (−30° C. for 15 minutes a ⇔ 100° C. for 15 minutes, 500 cycles) was conducted, no crack occurred in a solder joint portion.

Comparative Example 1

The CFRP core shown in FIG. 6 was obtained as in Example 1. Subsequently, a semi-cured highly thermally conductive resin sheet (thickness: 120 μm) having mold releasing films made of a material identical to that for Example 1 attached on top and bottom surfaces thereof was prepared. Next, with the mold releasing film on one surface being peeled off, the highly thermally conductive resin sheet was vacuum laminated using a stainless smoothing plate. This step was repeated twice to bond the highly thermally conductive resin sheets with a thickness of 240 μm to each of the top and bottom surfaces of the CFRP core. On this occasion, primary through hole 3a was filled with the highly thermally conductive resin sheets as much as possible. The vacuum lamination was performed by vacuuming for one minute at 150° C., and then applying pressure at 10 kg/cm² for two minutes. Thereafter, the process identical to that in Example 1 was performed to obtain a printed wiring board.

The obtained CFRP core substrate had a thickness of about 1.2 mm. In addition, when a cross section thereof was observed, no voids were found.

Although the embodiments and examples of the present invention have been described above, it is also originally intended to combine features of the embodiments and examples as appropriate. Further, it should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is particularly advantageously applicable to a method of manufacturing a printed wiring board having a core including CFRP, and the printed wiring board.

DESCRIPTION OF THE REFERENCE SIGNS 1, 10, 20, 30: printed wiring board, 2a, 2b: signal circuit layer, 3: CFRP core, 3a: primary through hole, 3b: coating layer, 3c, 51: copper foil, 4a: the first adhesive member, 4b: the second adhesive member, 5 insulating resin, 6a: the third adhesive member, 6b: the fourth adhesive member, 7: penetrating through hole, 7a: secondary through hole, 8: laminated body, 8a, 8b: mold releasing film, 9, 40: two-layer board, 9a, 50: insulating base material, 9b: signal interconnection, 52: resin, R3a, R7a: diameter, X: axis.

The invention claimed is:

1. A method of manufacturing a printed wiring board, comprising the steps of:
    forming first and second laminated bodies each having first and second adhesive members;
    laminating said first laminated body and said second laminated body so that said first laminated body and said second laminated body are symmetric to each other about a central line located between said first and second laminated bodies, by forming a positioning hole in said first laminated body when said first and second adhesive members are in an uncured state, and inserting a positioning member into said positioning hole to perform positioning; and
    forming interconnections on said first and second laminated bodies,
    wherein said step of forming said first and second laminated bodies includes the steps of
        forming a core including carbon fiber reinforced plastic having a primary through hole,
        temporarily pressure-bonding the first adhesive member on a lower surface of said core to cover said primary through hole,
        charging an insulating member into said primary through hole by screen printing, and
        temporarily pressure-bonding the second adhesive member on said insulating member on an upper surface of said core, and
    wherein the insulating member is charged after formation of the first adhesive member.

2. The method of manufacturing a printed wiring board according to claim 1, wherein
    said step of forming said first and second laminated bodies further includes the steps of forming a third adhesive member below said first adhesive member, and forming a fourth adhesive member on said second adhesive member, and
    in said step of laminating, said first laminated body and said second laminated body are laminated by forming a positioning hole in said first laminated body when said first, second, third, and fourth adhesive members are in an uncured state, and inserting a positioning member into said positioning hole to perform positioning.

3. The method of manufacturing a printed wiring board according to claim 1, wherein, in said step of laminating, a multi-layer board having a pattern and an insulating base material covering said pattern is disposed between said first laminated body and said second laminated body.

* * * * *